(12) United States Patent
Watkins

(10) Patent No.: US 6,646,454 B2
(45) Date of Patent: Nov. 11, 2003

(54) ELECTRONIC APPARATUS AND METHOD FOR MEASURING LENGTH OF A COMMUNICATION CABLE

(75) Inventor: Lee A. Watkins, Thousand Oaks, CA (US)

(73) Assignee: Test-Um, Inc., Camarillo, CA (US)

( * ) Notice: Subject to any disclaimer, the term of this patent is extended or adjusted under 35 U.S.C. 154(b) by 0 days.

(21) Appl. No.: 10/141,368

(22) Filed: May 7, 2002

(65) Prior Publication Data
US 2003/0128039 A1 Jul. 10, 2003

Related U.S. Application Data
(60) Provisional application No. 60/345,512, filed on Jan. 7, 2002.

(51) Int. Cl.$^7$ .............................................. G01R 27/26
(52) U.S. Cl. ........................................ 324/674; 324/662
(58) Field of Search ................................ 324/674, 662; 340/870.37

(56) References Cited

U.S. PATENT DOCUMENTS

| | | | | |
|---|---|---|---|---|
| 3,761,805 A | * | 9/1973 | Dornberger | 324/677 |
| 4,621,227 A | * | 11/1986 | Venema | 324/678 |
| 5,339,022 A | * | 8/1994 | Fleming et al. | 324/662 |
| 6,008,654 A | * | 12/1999 | Chaskell | 324/519 |
| 6,573,733 B2 | * | 6/2003 | Bohley | 324/658 |

* cited by examiner

Primary Examiner—N. Le
Assistant Examiner—Timothy J. Dole
(74) Attorney, Agent, or Firm—Gene W. Arant

(57) ABSTRACT

The length of an electrical cable is measured from only one of its ends, even though much of the cable may not be visible and its remote end may not be accessible. The ends of a conductor pair are selected to serve as contacts for a test capacitor. A reference capacitor having known capacitance value, and the test capacitor, are alternately inserted into an oscillator circuit while measuring the oscillator frequency. The two oscillator frequencies are compared to provide a ratio, which is then mathematically combined with a number indicative of the capacitance per unit length of the cable so as to produce an output number representing cable length.

10 Claims, 7 Drawing Sheets

ELECTRONIC APPARATUS AND METHOD FOR MEASURING LENGTH OF A COMMUNICATION CABLE

PRIORITY CLAIM

This patent application claims priority of my U.S. Provisional Patent Application Serial No. 60/345,512 filed Jan. 7, 2002.

FIELD OF THE INVENTION

This invention relates to the precision testing of electrical cable, and particularly to measuring the length of a cable that is used for electronic communications.

BACKGROUND OF THE INVENTION

In the installation and maintenance of communications cables there are many parameters that need to be known to the craftsman in order for him to be able to accomplish his work most rapidly and correctly. Electrical cables come in many different sizes and shapes. A cable can be twisted pair, coaxial, ribbon (or so-called "satin"), Romax, or any similar type. Cables are usually made of consistent geometry over their entire length. The tests for possible short circuits, open circuits, and incorrect conductor pairing have long been standard. Conductor paths are also traced to determine whether two cable ends belong to the same cable.

In recent years instrumentation has been provided that allows a craftsman to make a number of different tests with a single test instrument. The instrument is connected and turned on, its internal computer then goes into operation, and its visual and/or other outputs can then rather instantaneously provide results of a sequence of different tests.

One measurement that is often needed is the length of a cable. Measuring length is often difficult, especially when the cable is routed through building walls and floors, underground, or intertwined with other cables, and is not visible throughout its route. Several different methods have been known. The present invention provides a method that can be used at only one end of a cable for precisely measuring its length.

PRIOR ART

U.S. Pat. No. 5,339,022 issued Aug. 16, 1994.

SUMMARY OF THE INVENTION

According to the present invention the capacitance per unit length of the cable, if not previously known, will first be determined. The present invention applies to a cable that has a uniform physical characteristic throughout its length, and hence also has presumably uniform capacitance per unit length.

According to the novel method of the present invention a reference capacitor of known value and one end of the cable under test are alternately inserted into a stable oscillator circuit. The two resulting oscillator frequencies are measured and compared, and their ratio is then used to calculate the cable length. The two measurements are made in rapid succession, preferably within a fraction of a second, so most variables that influence the oscillator frequency will cancel out in determining the final length measurement.

Further according to the invention, the oscillator frequency is determined by counting pulses during a predetermined time period, and the output signal is converted into sharpened pulses for better accuracy in the counting process.

As a further feature of the invention, the length of the predetermined time period during which oscillator output is observed may be adjusted or varied in accordance with the length of the cable, to improve the accuracy of measurement.

The object of the present invention, therefore, is to rather precisely measure the length of a cable from only one of its ends, in a fast and accurate manner.

DRAWING SUMMARY

SYSTEM SCHEMATIC

(FIG. 1)

Figure 1:
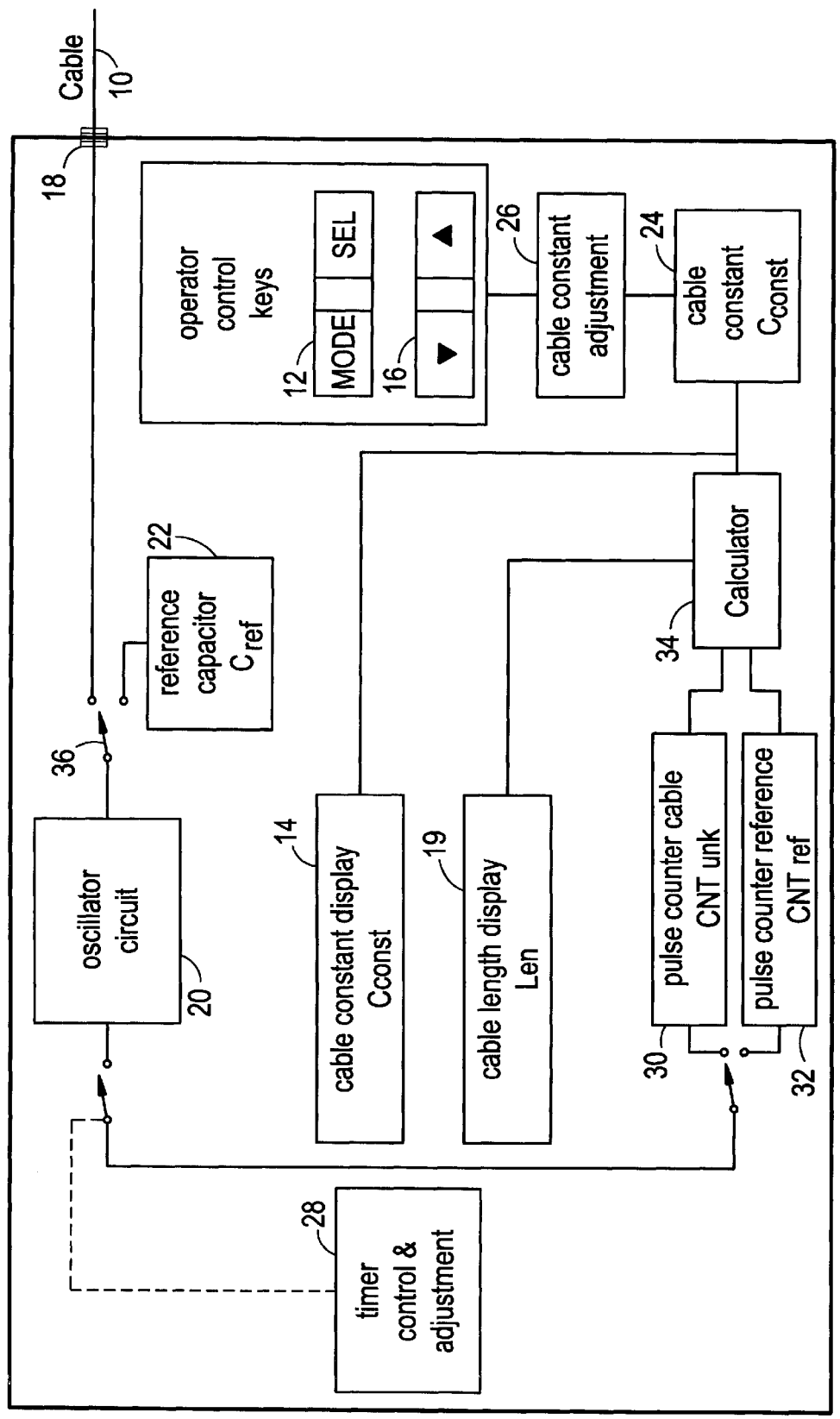
FIG. 1 is a one-line schematic representation of the system of apparatus provided in accordance with the invention.

Reference is now made to FIG. 1 wherein the system of apparatus in accordance with the invention is schematically illustrated. The identifications of the various numerical or mathmatical parameters that are involved in the measurement process, the mechanical apparatus and visual display elements of the system, and the major electronic circuit components, are as follows:

Important Parameters (Numerical)

Len=length of the cable, to be determined
Cconst=cable constant, capacitance per unit length of cable
Cref=known capacitance value of a reference capacitor
Cunk=total capacitance (unknown) of entire length of the cable
PDT=a predetermined time period (gate) of oscillator output
CNTref=oscillator cycles (pulses) during PDT for capacitor Cref
CNTunk=oscillator cycles (pulses) during period PDT for Cconst
R=ratio of CNTunk to CNTref.

Mechanical Apparatus and Visual Displays

10=Cable to be tested
12=Start Button or Mode Switch
14=LCD display for visually displaying Cconst, capacitance per unit length of the cable
16=manual adjust of stored value of cable constant Cconst
18=means to connect one end of the cable to test circuitry
19=LCD display for displaying calculated cable length Len Major Electronic Components

20=oscillator
22=a reference capacitance of known standard value Cref
24=a circuit for storing the numerical value of Cconst
26=control circuit responsive to manual adjustment means 16 for changing the stored value of Cconst
28 timer
30, 32 pulse counters
34 calculator or arithmetic unit
36 switch means to connect selected capacitor into oscillator Description of FIG. 1

As shown in FIG. 1, external to various parts of the test circuitry are a cable 10 to be tested, a Start Button 12, and an LCD display 14 for visually indicating numerically the capacitance per unit length Cconst of the particular cable that is to be tested. A manual adjustment means 16 is provided for manually adjusting the stored numerical value Cconst so as to accurately correspond to the per unit length capacitance of the particular cable that is going to be tested. Connection means 18 is provided for connecting one end of the cable 10, the length of which is to be measured. Although FIG. 1 is shown in single line diagrammatic form, it will be understood that the cable 10 has two conductors separated by a dielectric material. An LCD display 19 visually displays calculated length Len of the cable.

Within the circuitry there is an oscillator 20, a reference capacitance 22 of known standard value Cref, a storage circuit 24 for storing the numerical value of Cconst, and display control circuit 26 which is responsive to a manual actuation of the adjustment means 16 for changing the stored value of the cable capacitance constant Cconst. Also included in the circuitry are a timer 28, pulse counters 30 and 32, and a calculator 34. Pulse counter 30 stores the oscillator pulse count corresponding to the cable, or unknown capacitance Cunk, while pulse counter 32 stores the oscillator pulse count that corresponds to the reference capacitor Cref. Switch means 36 is provided to selectively connect either the reference capacitor Cref, or one end of the cable being tested, into the oscillator circuit 20.

Operation, in General

The operator proceeds as follows. The start button 12 is first actuated in order to energize the entire circuit. Then the stored numerical value of Cconst is verified, or is adjusted as may be necessary using adjustment controls 16, 26. Then the one end of the cable 10 under test is connected to the test apparatus at connection 18. At that point the internal electronic circuitry assumes control of the further steps.

Under control of the electronic circuitry the reference capacitor Cref, and the cable end, are operatively placed in the oscillator circuit, one at a time. Although a switch 36 is shown schematically in the diagram it will be understood that switching action is accomplished electronically under control of circuitry, not specifically shown in FIG. 1. For each of the selected capacitors, when it operatively becomes part of the oscillator, the timer measures a known time period PDT during which an associated counter, 30 or 32, records the number of pulses generated by the oscillator. Three numerical inputs are then provided to the calculator 34; the stored value Cconst for the particular cable; the pulse count CNTref for the reference capacitor Cref; and the pulse count CNTunk for the cable. From these inputs the calculator then calculates the cable length Len, which is visually displayed on LCD output display device 19.

Figure 2:
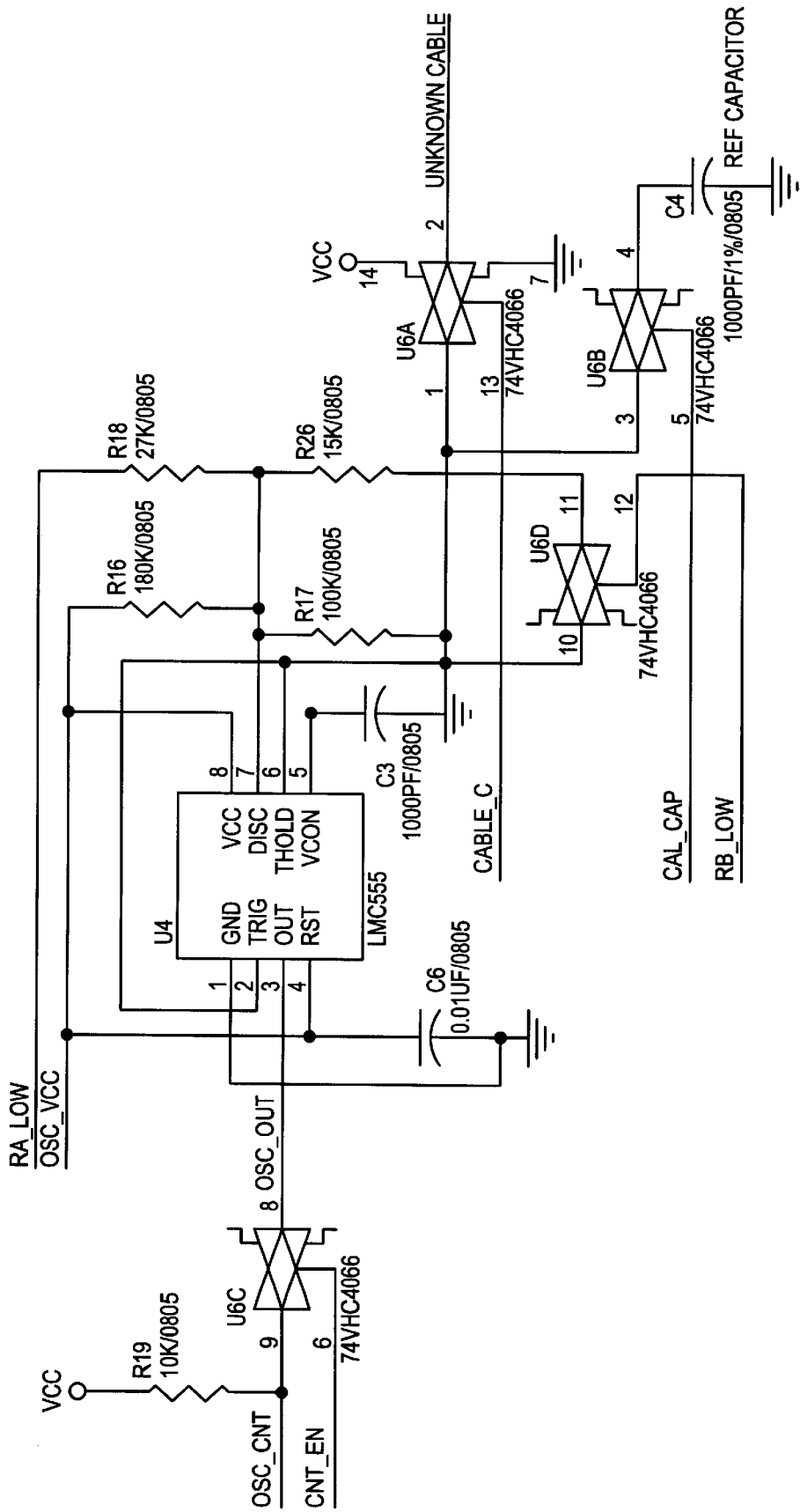
FIG. 2 is a schematic diagram of the circuitry portions that particularly pertain to operation of the present invention.
Figure 3A:
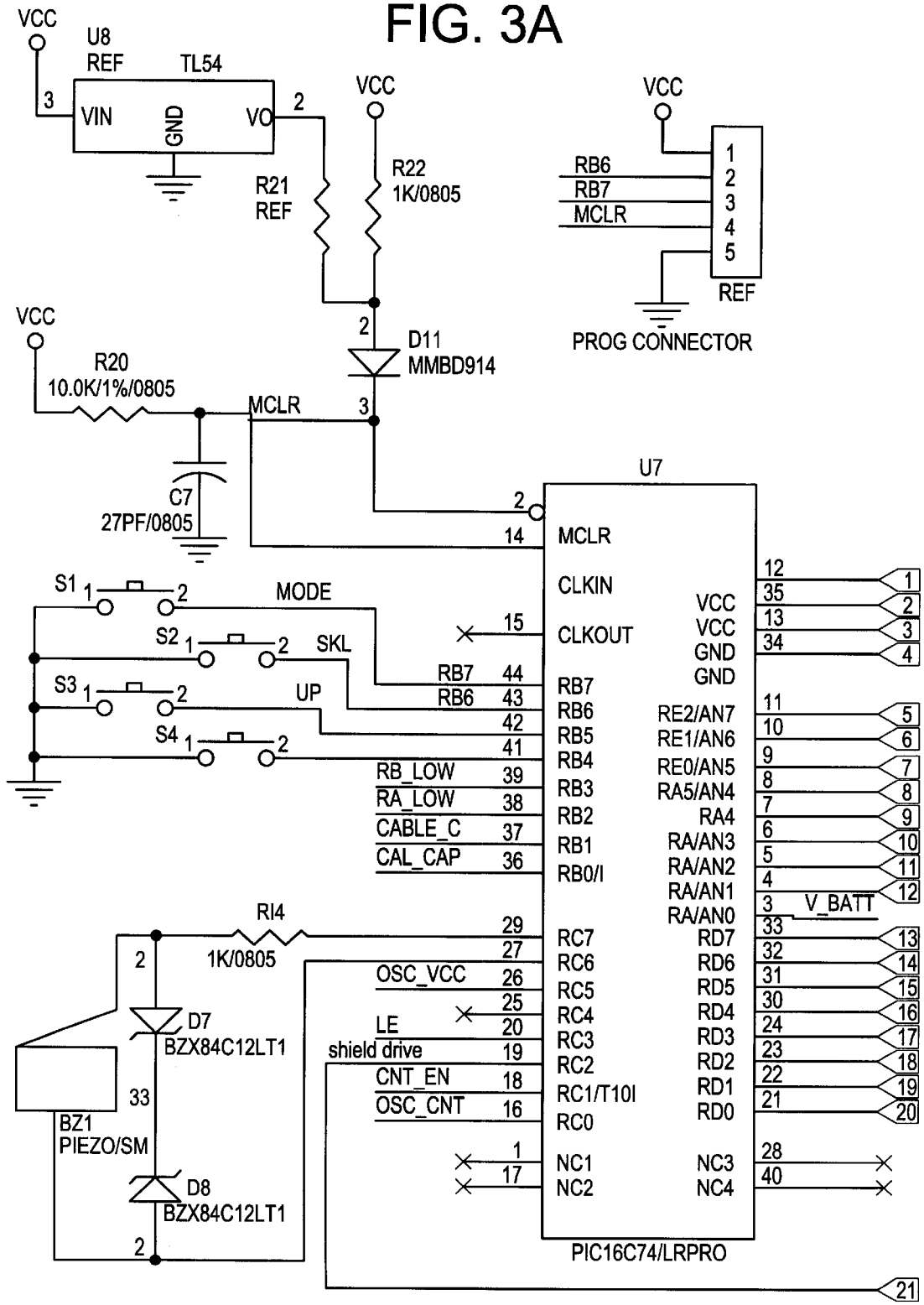
FIG. 3, shown in various separate parts on separate sheets but with portions overlapping for clarity, is a schematic drawing of the entire test apparatus including a microprocessor that also controls test functions other than length measurement.
Figure 3B:
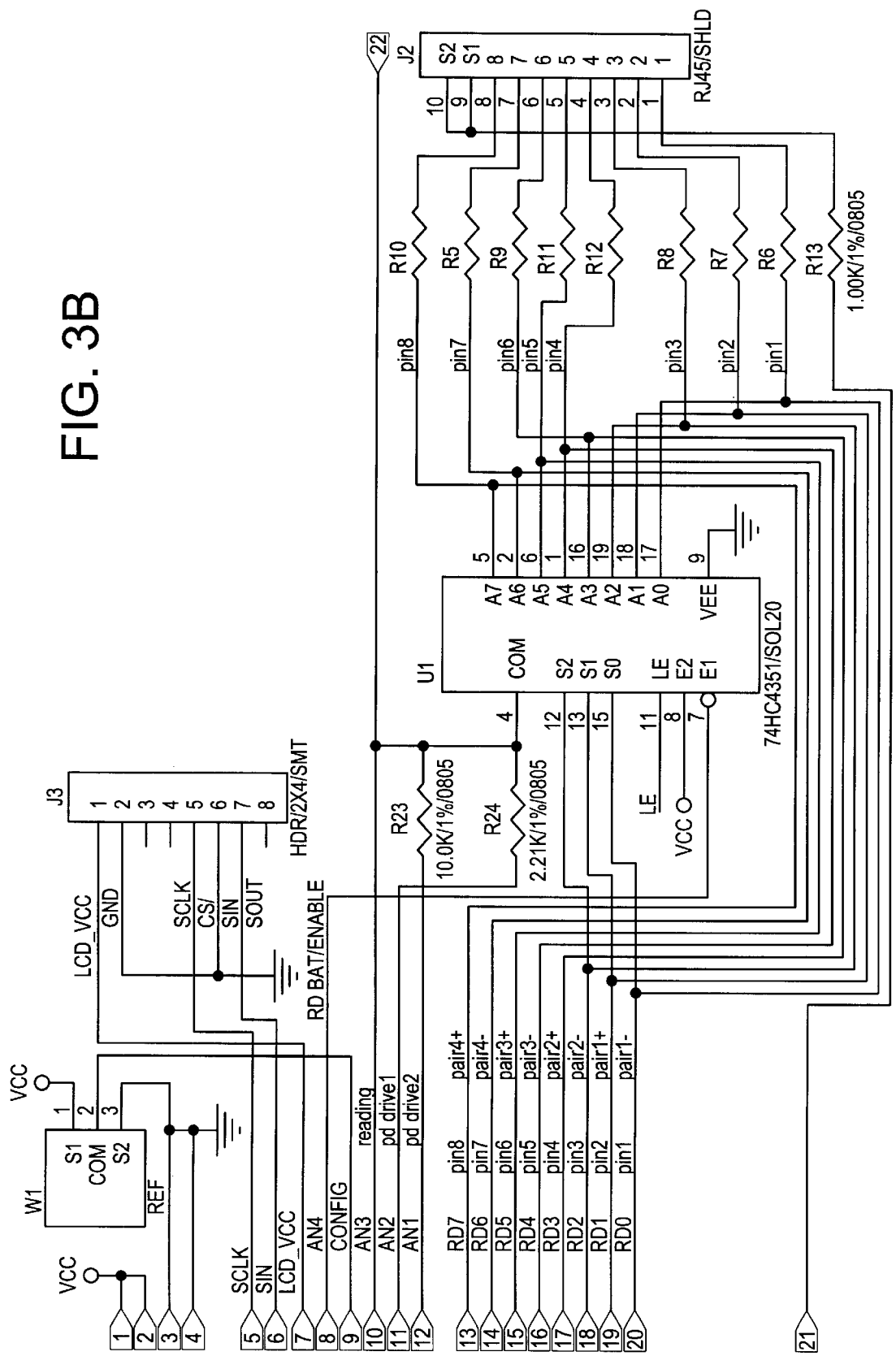
Figure 3C:
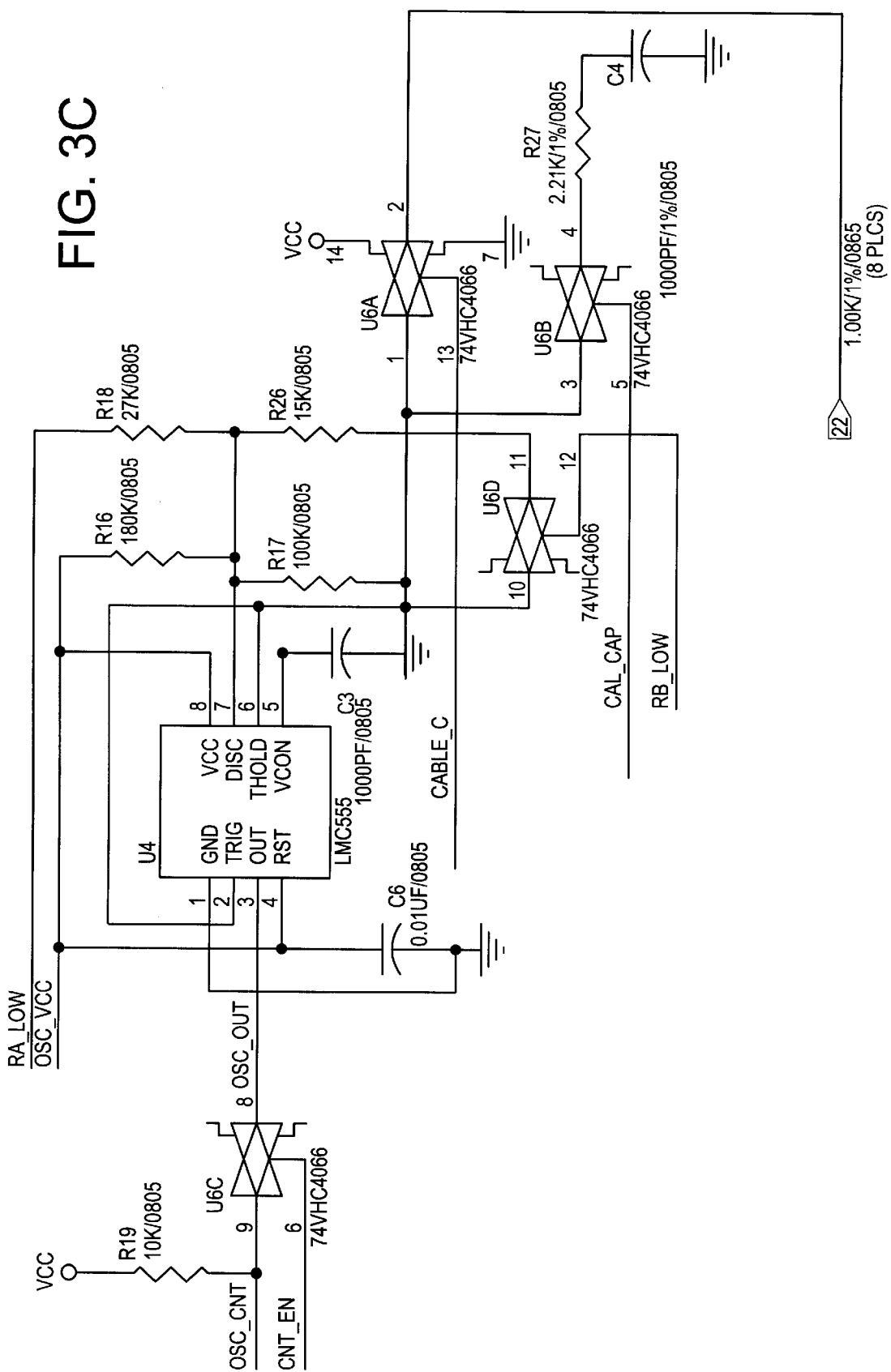
Figure 3D:
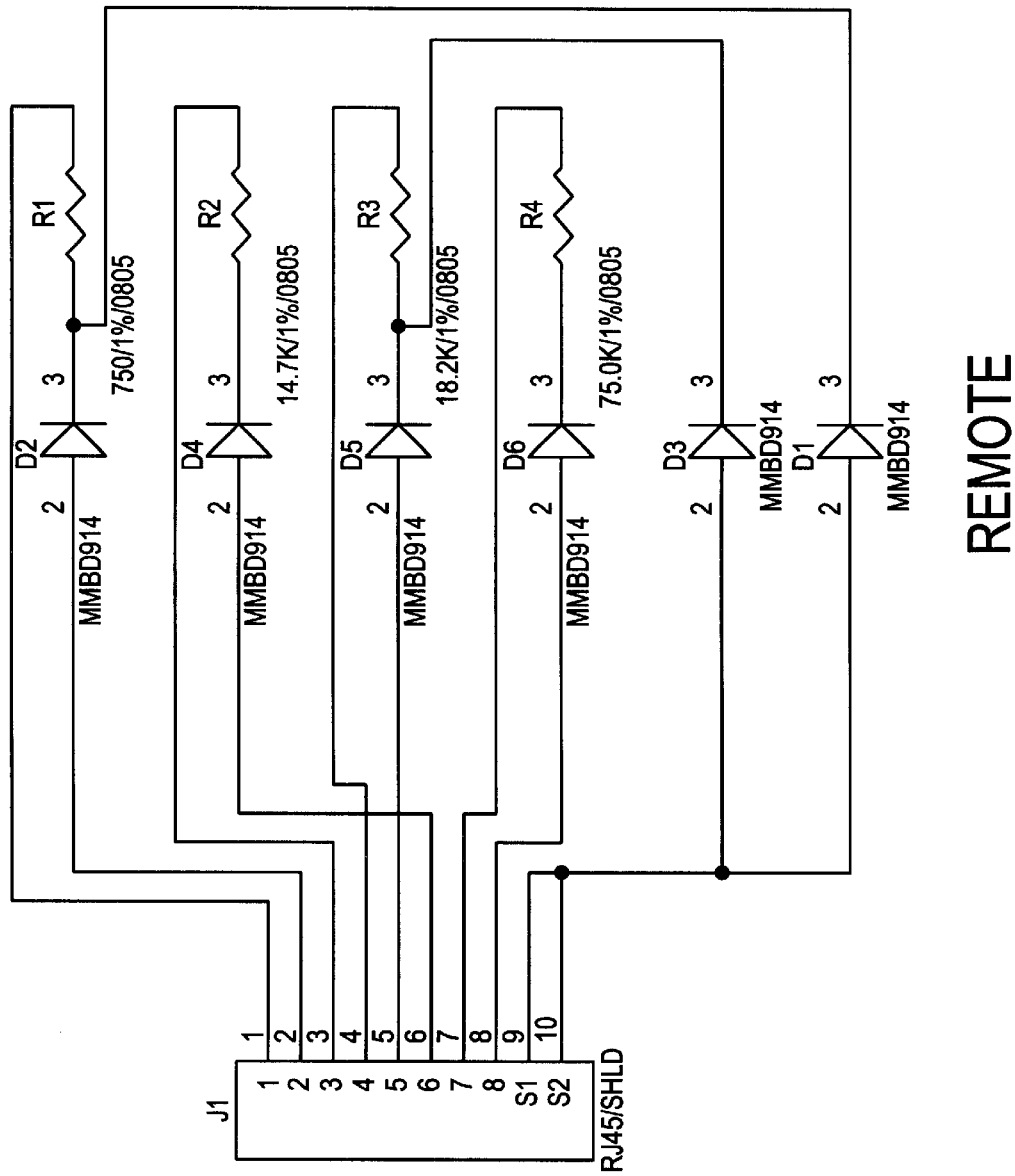
Figure 3E:
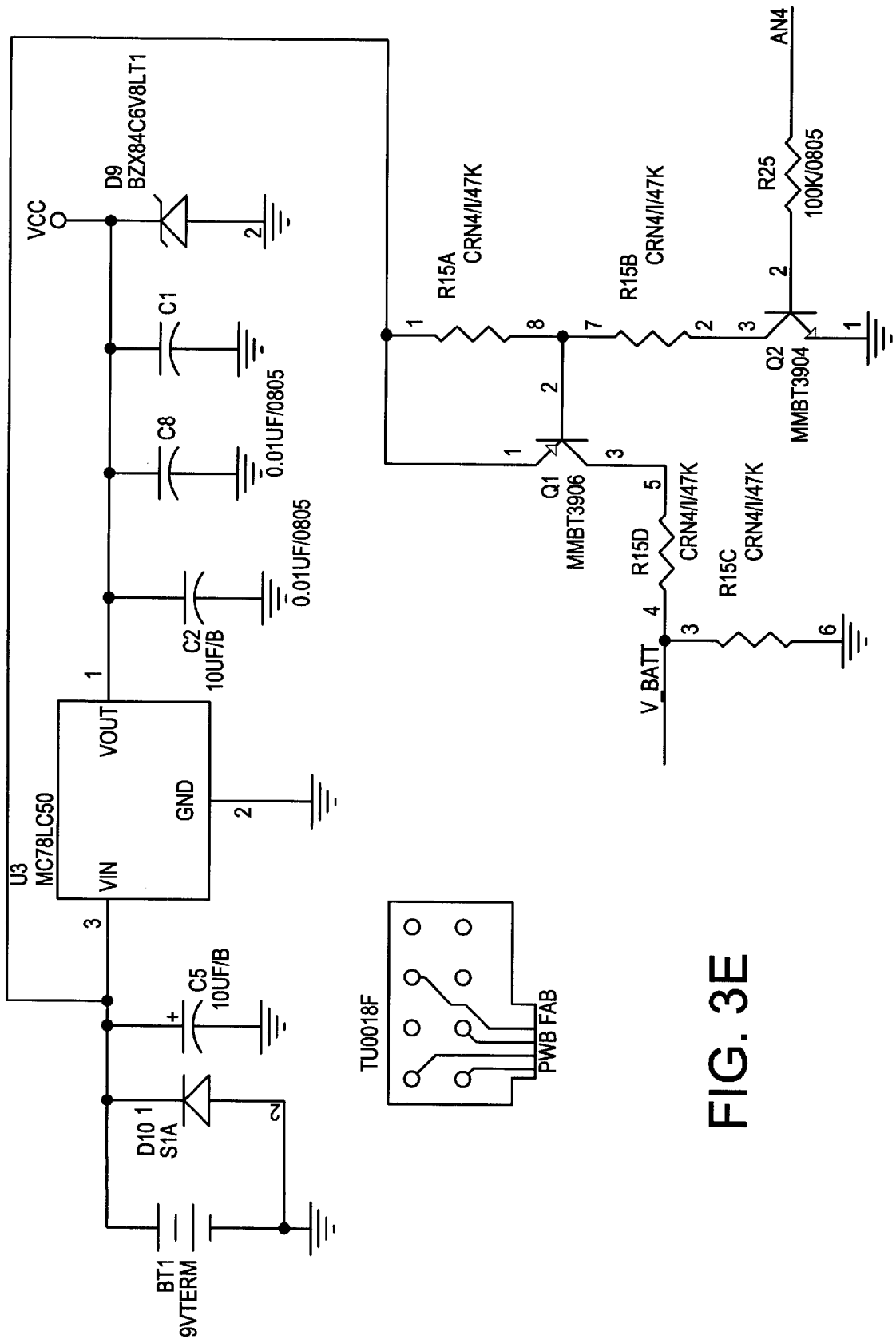

DESCRIPTION OF PREFERRED EMBODIMENT (FIGS. 2 and 3)

Reference is now made to drawing FIGS. 2 and 3 in which the presently preferred form of circuitry is shown in detail.

The reference capacitance Cref is connected to an oscillator circuit. The capacitance, Cref, along with known resistors form a RC circuit which will oscillate at a frequency which is a function of Cref. The frequency output by the oscillator is measured by counting the number of shaped pulses output over a known time interval (gate time). This first count is saved by a microprocessor in software (CNTref).

The Cref capacitor is disconnected and then the cable whose length is to be measured is connected to the same oscillator circuit. The frequency output by the oscillator is now determined by the value of the cable capacitance, Cunk. Again, the frequency is measured by counting the number of shaped pulses output over the same known time interval (gate time). This second count is saved by a microprocessor in software (CNTunk).

The two counts, first using Cref and then Cunk, are taken as close together in time as practical to reduce any inaccuracies caused by thermal temperature changes, drift in the circuits and any other physical changes that vary with time. The two parameters are used in Equation 1 to calculate the total cable capacitance, Cunk.

$$Cunk=(CNTref/CNTunk) \times Cref \qquad [\text{Eq. 1}]$$

The microprocessor is used to calculate both Equation 1 and 2. The next calculation finds the cable length using the formula in Eq. 2. The variable Cconst is a function of the cable type only, and is the capacitance per unit length. For any one type of cable, Cconst is a constant.

$$Len=Cunk/Cconst \qquad [\text{Eq. 2}]$$

The cable length, Len, is shown to the operator on a LCD display. The system of units is either English or Metric, depending on the settings input by the operator.

DETAILED DESCRIPTION

Concept

The concept of this circuit is that very few precision components are required to achieve an apparatus for measuring capacitance very accurately. What is required is a stable capacitor of known value (Cref), together with an oscillator whose frequency is a known function of the timing capacitor. All other parameters, e.g., voltage, temperature, component values, are unimportant as long as they all remain stable for short periods of time, less than 1 second. The oscillator frequency is measured by counting the shaped pulses output during a known time interval, called here the gate time. After the oscillator output using the Cref has been counted, the cable whose length is unknown replaces the reference capacitor Cref. The oscillator frequency is again measured by counting the shaped pulses output during the known time interval. The total cable capacitance, Cunk, is the ratio of the number of cycles of the oscillator connected to Cref to the number of cycles of the oscillator connected to the unknown cable capacitance times the value of Cref as given in Equation 1.

$$Cunk=(CNTref/CNTunk) \times Cref \qquad [\text{Eq. 1}]$$

This can be shown by taking the formula for frequency of the oscillator and taking the ratio of the two equations that result using the unknown and reference capacitors in otherwise identical circuits. Referring to the oscillator schematic, notice U4 is a LMC555 timer integrated circuit (IC) wired as an astable multivibrator. For this integrated circuit the frequency is given by Equation. 3.

$$Freq = \frac{1.44}{(R_A + 2R_B) \times C} \qquad [\text{Eq. 3}]$$

Because the only variable that changes is C, all parameters cancel out except the two frequencies and the two capacitances. The frequency is known by taking the number of cycle counts and dividing by the gate time using cycle counter techniques. Again, due to taking the ratio, the actual gate time drops out of the equations when cycle count and gate time are substituted for frequency in the oscillator equations.

Now that the cable capacitance, Cunk, has been calculated, the cable length is found by dividing by the cable capacitance per unit length, as given by Eq. 2.

[FIG. 1 is the drawing Test-Um dated Feb. 06, 2002. with the addition of the microprocessor]

Implementation

The invention implements this concept in the following manner. This description has been divided into two parts, one for all the components external to the microprocessor (hardware) and another for those functions performed by the software within the microprocessor.

External to Microprocessor

1. The operator attaches the cable whose length is to be measured to the device by connecting the cable to jack J2. If the cable is of industry standard type Cat5, which contains 8 conductors (four conductor pairs), they are connected directly to jack J2, which is an industry standard RJ45 connector used with cable type Cat5. If the cable is of some other type, it is attached to jack J2 with an adapter device so two cable conductors are connected to one pair of pins of jack J2. Usually pins 1 & 2 are used. Should the cable contain other conductor pairs, they are connected to another pair of jack J2 pins. Other pairs that can be used, the list of choices is: 1 & 2, 3 & 6, 4 & 5, or 7 & 8. How the invention selects a pair of conductors for the length measurement is described later.

2. If the cable is not terminated by a terminating device at the remote end, the invention power is turned on by the operator pushing any one of the four keys on the control panel. These are the four keys: MODE, SEL, UP, DOWN (which are connected to the microprocessor pins RB4, RB5, RB6, or RB7). The pushing on any key is sensed by the microprocessor, which then begins the power up process.

3. If the cable is terminated with a remote terminating device, current begins to flow from the battery in the device through one or more pair of cable wires as soon as the cable is connected to the device. This flow is sensed by the microprocessor (using input/output pins RD0 through RD7), which then begins the power up process. No operator action is needed in this case.

4. The invention checks to determine if any voltage is present on the cable, as well as any short circuit that would possibly invalidate any length measurements. The operator is notified on the device LCD display if any such problems are present. The detection of short circuits and voltage on the cable is not part of this patent application.

5. The microprocessor disconnects the cable from the oscillator circuit U4 by setting the switch U6A open. The reference capacitor is connected to the oscillator by setting the setting switch U6B closed. The reference capacitor Cref is now connected to the oscillator timer integrated circuit U4. Now Cref and associated circuitry ($R_A$ and $R_B$, see Eq. 3) control the oscillator frequency.

6. The frequency of oscillation, see Eq. 3, depends on the values of $R_A$, $R_B$ and C. C will be Cref at this time. Nominally $R_A$ is R16 and $R_B$ is R17. In later step 10, C will be Cunk.

7. At some clock time T0 the microprocessor closes analog switch U6C. Shaped pulses from the oscillator output line OSC_OUT are now received at the microprocessor pin RC0. They were not received before time T0 because switch U6C was open. Shaped pulses from the oscillator output (OSC_OUT) are received at the microprocessor (pin RC0). The microprocessor counts the received pulses and increments a software counter CNT, once for each pulse. After the clock time has elapsed to the desired gate time interval, the microprocessor opens analog switch U6C. The nominal value for the gate time is approximately 160 milliseconds. Because this same gate time will be used for measuring both the reference and the cable capacitance, an exact absolute time measurement is not required. The only requirement is that the same interval be used in both cases.

8. Now the software counter CNT contains a count for each frequency pulse received during the timer gate interval. The counter is stored in counter CNTref.

9. After a measurement is conducted with the reference capacitor Cref, the process is repeated using the cable instead of the reference capacitor. The reference capacitor is disconnected from the oscillator circuit by having the microprocessor set switch U6B open. The microprocessor then closes switch U6A, which connects the cable to the oscillator instead of the reference capacitor.

10. The frequency of oscillation, see equation 3, depends on the values of $R_A$, $R_B$ and C. C is now the cable capacitance, Cunk. Nominally $R_A$ is R16 and $R_B$ is R17. When a long cable is being measured and the oscillator frequency is too low for accurate measurements, R18 will be connected in parallel with R16 and perhaps R26 is connected in parallel with R17. This allows the effective $R_A$ and $R_B$ resistances to be reduced to keep the frequency higher as the unknown capacitance increases in value. See step 13 for details describing how this is implemented.

11. At some clock time T0 the microprocessor closes analog switch U6C. Shaped pulses from the oscillator output line OSC_OUT are now received at the microprocessor pin RC0. They were not received before $T_0$ because switch U6C was open. The microprocessor counts the received pulses and increments a software counter CNT, once for each pulse. After the clock time has elapsed to the desired gate time interval, the microprocessor opens analog switch U6C. The nominal value for the gate time is approximately 160 milliseconds. Because this same gate time was used for measuring both the Cref and the cable capacitance, an exact absolute time measurement is not required. The only requirement is that the same interval be used in both cases.

Now the software counter CNT contains a count for each frequency pulse received during the timer gate interval. The counter is stored in CNTunk.

12. The microprocessor compares the count CNTunk with minimum and maximum allowable count values that are stored in the microprocessor memory. If the Cunk measurement does not have a sufficient number of counts for the resolution required (a minimum of 256 counts is needed for 0.4% resolution), the gate time or the timing resistors or both may be changed. If the counter overflows, the gate time may be reduced. It is possible to use two different gate times for the two counts as long as the gate time factor is accounted for in the calculation of capacitance. As long as the two gate intervals are derived from the same timing source, the ratio between the Cref and Cunk measurements will eliminate any time base uncertainty.

13. In step 12, should the count value be too low, which will be the case when the cable is very long and thus has high capacitance, R18 and R26 are used to reduce $R_A$ and perhaps $R_B$ in equation Eq. 1. This will cause the oscillator frequency to increase. When a long cable is being measured and the oscillator frequency is too low for accurate measurements, R18 will be connected in parallel with R16 by having the microprocessor to drive the line RA_LOW to VCC instead of being at high impedance. For the same reason, R26 is connected in parallel with R17 by having the microprocessor close the analog switch, U6D, with the signal RB_LOW. This allows the effective $R_A$ and $R_B$ resistances to be reduced to keep the frequency higher as the unknown capacitance increases in value.

14. Should the count value be too high, which will be the case when the cable is very short and thus has low capacitance, the time interval during which switch U6C is closed will be decreased by the microprocessor software.

15. If both counts CNTref and CNTunk are within the prescribed maximum and minimum limits, step 16 is executed. Otherwise the appropriate changes are made by the microprocessor to the values of $R_A$, $R_B$ and the gate interval. This is described in steps 12, 13 and 14. Then steps 5 through 14 are repeated.

16. Now counts CNTunk and CNTref have been determined, are within limits, and are in the microprocessor memory. The value of the cable total capacitance is calculated. The microprocessor calculates the cable total capacitance Cunk by the formula Eq. 1.

The formula is derived by noting because the comparison is between a known and unknown capacitance, all other variables, such as voltage, temperature, resistor values, time base fluctuations, are not part of the measurement process. They all cancel in the equation provided they remain stable for a short interval, less than one second.

The actual frequency of the oscillator is not required because only the pulses are counted during the time gate interval. If the same gate duration time is used with the reference capacitor and with the cable, all the variables cancel in the equation Eq. 1. If the gate duration time is decreased because the counter overflowed, Eq. 1 is modified by the ratio of the two time durations. See step 12 for details concerning counter overflow.

17. The Cunk is divided by the Cconst to yield the cable length, as given in Eq. 2

$$Len = Cunk/Cconst \qquad [Eq. 2]$$

where

Len is the cable length

Cconst is the capacitance per unit length of cable.

The formula for the cable length requires knowing the value of capacitance per unit length of cable, Cconst. The value of Cconst is derived by using the method described in step 18 or step 19.

Determining Cable Constant if not Known

18. Method 1 of obtaining the cable capacitance per unit length (Cconst). The operator enters the value of Cconst, obtained from vendor specifications or a handbook, by pressing the up and down arrow keys on the device control panel to adjust the length constant value displayed on the LCD line 2. As long as a key is pressed, the microprocessor increases (or decreases) the value of Cconst shown on the display. The operator presses keys until the desired value is displayed on the LCD. The microprocessor uses this value in the length formula (Eq. 2). For example, if the vendor specifications or handbook value for a particular kind of cable is 15.0 picofarads (pf) per foot, the operator pushes the up arrow or down arrow keys on the device until the display reads "15.000 pf/ft." The microprocessor uses this value 15.000 for Cconst in Eq. 2 to calculate Len. The invention currently displays a maximum value of 40.000 pf/foot to a minimum value of 10.000 pf/foot in increments of 0.125 pf/foot.

19. Method 2 of obtaining the cable capacitance per unit length (Cconst). This method can be used for cables of unknown capacitance per unit length. A cable of known length of the same kind as the cable whose length is to be measured is connected to the device. The device will display on the LCD line 1 a length value. The control panel up and down arrows are used by the operator to increase or decrease the capacitance per unit length value (which is displayed on the LCD line 2) until the displayed cable length value calculated by the device equals the known length. The capacitance per unit length value is now displayed below the length on the LCD line 2. The cable of known length is removed and replaced by the cable of unknown length.

20. The means by which the cable is connected from Jack J2 to the oscillator is described here. The cable whose length is to be measured is connected to J2, as described in steps 1, 2 and 3 above. Each pin of J2 is connected to both the switch U1 (pins A0 through A7) and the microprocessor (pins RD0 through RD7). The microprocessor sends a signal to input LE of U1 which causes switch U1 to select one of the lines from J2. This causes one and only one selected line to be connected by switch U1 to the oscillator. Thus the switch connects the selected pin of J2 to output COM, which is wired to switch U6A. The pins of J2 are organized in pairs. The other line of this cable pair is connected to the microprocessor at port RD0 through RD7. The microprocessor sets the line of this pair to ground, meanwhile setting the other unused ports ($RD_x$) to high impedance.

As an example, an adapter may connect the two wires of a twisted pair cable to pins 1 and 2 of Jack J2. The microprocessor will cause switch U1 to connect pin 1 to the oscillator circuit through switch U6A. The microprocessor will set the J2 pin 2 to ground using port RD1. Now the twisted pair cable capacitance is used in the oscillator circuit.

21. The operator can select which pair of wires are to be used in measuring length. When the device is in the length measuring mode, the operator has five options. The SEL switch on the device control panel is pressed to cycle over the five options, which are: pair 1 & 2, 3 & 6, 4 & 5, 7 & 8 or auto-select. The 2 pair numbers selected are displayed on the LCD line 1 after the length (except for the auto-select option). If the selected pair has a fault, such as a short circuit, then the length is not displayed. If the auto-select option is active, the microprocessor will try pairs 1 & 2, 3 & 6, 4 & 5, 7 & 8, in order to find and use the first pair that has no fault. A fault is defined as a pair that indicates: short, split pairs.

22. The invention will display the results in either Metric or English units. The microprocessor calculates the length in feet or meters depending on the system input value during setup. Here is a description of how the system of units is selected by the operator.

The operator sets the MODE key on the operator control panel until SETUP is displayed on the LCD. The SEL key is pressed once. The operator then presses the up or down arrow keys (↑ and ↓) until "Units" is displayed. The SEL switch is then used to toggle between "Feet" and "Meters." Whichever system of units is last displayed in the setup mode will be used in calculating the cable length. The last selected system of units, Metric or English, is used until the system of units is changed by the operator.

23. The length in the requested units is displayed on the LCD display line 1. The capacitance in picofarads per unit length (Cconst) is displayed on the LCD display line 2.

24. There is in any electronic device, including this one, some residual capacitance that is not part of the connected cable but inherent in the device itself. The wires, circuit boards and the connector to the unknown cable have associated capacitance which is not part of the cable capacitance. A calibration procedure is used to remove the affect of this residual capacitance from the measured cable capacitance. This calibration is performed whenever the microprocessor has lost power, such as when the battery BT1 is replaced.

The residual capacitance value stored in the microprocessor memory is lost and must be recalculated.

The operator removes any cable connected to the device. The battery BT1 is replaced. The microprocessor performs steps 5 through 16 to measure the residual capacitance, see Eq. 1. The microprocessor subtracts this residual capacitance from Cunk to improve the length measurement accuracy for all subsequent length measurements. If this residual capacitance were not subtracted, the length value will be too great.

Microprocessor Operation

The steps 1 through 24 above described the operation of the hardware that comprises this invention. This next section will outline the functions performed by the microprocessor software. The steps are numbered beginning with 101 so no confusion will result between the hardware and software sections.

Functions not directly related to the patent are not described here. This includes testing for cable short circuits, open circuits, miswired pairs, device power on, device power off, LCD display driver, device shutdown when there is no activity.

101. Length Measure Process
1. disconnect the cable from the oscillator circuit by setting switch U6A open.
2. disconnect the oscillator circuit from the microprocessor by setting switch U6C open.
3. initialize $R_A$ to R18 and $R_B$ to R16.
4. initialize all counters to zero and the gate duration to the default time interval.
5. connect the reference capacitor Cref to the oscillator circuit by setting switch U6B closed. Delay for oscillator to recover.
6. set time T0 to be the start time and set switch U6C closed.
7. count pulses received at microprocessor port RC0; save count in software counter CNT.
8. after time T1 is reached (T1−T0 is the gate duration time), set switch U6C open.
9. copy counter CNT value to counter CNTref.
10. initialize counter CNT to zero.
11. disconnect the reference capacitor from the oscillator circuit by setting switch U6B open.
12. select the cable pair at jack J2 and using switch U1 connect to switch U6A by process 106.
13. connect the cable pair to the oscillator circuit by setting switch U6A closed. Delay for oscillator to recover.
14. keep the same $R_A$ and $R_B$ and gate duration as in steps 101.5 through 101.8.
15. set time T0 as the start time and set switch U6C closed.
16. count pulses received at microprocessor port RC0, save count in software counter CNT.
17. after time T1 is reached (T1−T0 is the gate duration time), set switch U6C open.
18. copy counter CNT value to counter CNTunk.
19. examine the pulse count in counter CNTunk. If the value is not within maximum and minimum limits, execute process 107 and repeat steps 101.5 through 101.19.
20. calculate the cable capacitance correcting for the residual capacitance, Eq. 1, by using process 102.
21. calculate the cable length, Eq. 3, by using process 103.
22. display the length, units, cable pair numbers, and capacitance per unit length on the LCD display.

102. Cable Capacitance Calculation Process

The microprocessor calculates Cunk the total cable capacitance by the equation Eq. 1.

$$Cunk=(CNTref/CNTunk) \times Cref \qquad [\text{Eq. 1}]$$

where
Cunk is the total capacitance of the cable
CNTref is the pulse count from the oscillator using the Cref
CNTunk is the pulse count from the oscillator using the cable
Cref is known reference capacitor value 103. Cable Length Calculation Process The cable length is computed using Eq. 2. The variable Cconst is a function of the cable type only, and is the capacitance per unit length. For any one type of cable, Cconst is a constant whose value depends on whether English or Metric units are used.

$$Len=Cunk/Cconst \qquad [\text{Eq. 2}]$$

where
Len is the cable length
Cunk is from Eq. 1.
Cconst is the capacitance per unit length of cable.

104. Determine Cable Constant, Method 1

In the description following, the variable Cc represents the cable constant as it is being calculated, Cconst is the final variable used in process 103.
1. get current value of Cconst
2. store in Cc
3. show to operator on the LCD display
4. wait for operator to press either the up ↑ or down ↓ arrow key on the device.
5. after a key is pressed, increment Cc for up arrow, or decrement Cc for down arrow.
6. show new value of Cc to operator on the LCD display.
7. store the new value of Cc in Cconst.

The invention currently displays a maximum value of 40.000 pf/foot to a minimum value of 10.000 pf/foot in increments of 0.125 pf/foot.

105. Determine Cable Constant, Method 2

Method 2 of obtaining the cable capacitance per unit length (Cc) uses both the length measurement process 101 followed by 102. As the operator changes the Cconst value, process 101 will continue to change the length value displayed because Cconst has been changed.

Processes 101 and 102 are repeated until the operator stops changing Cconst.

106. Connect a Specific Cable Pair to the Oscillator Circuit

At initialization pair 1 & 2 are placed in the variable PAR.
1. examine the cable pair in PAR and determine if it has some fault. If so, do not continue to step 2 but instead show a fault indication to operator on LCD display, and go to step 9.
2. set subscript w to 0, subscript x to 1.
3. set pin microprocessor RDw to ground.
4. send signal on line LE to switch U1 to select Ax.
5. switch U1 will now connect input Ax to output COM. COM is wired to the switch U6A. In this manner the designated cable pair is used by the oscillator.
6. wait for the operator to press the SEL key on the device.
7. after the operator presses the SEL key, copy the next pair numbers into PAR. The values to be used are 1 & 2 (initialized value), then 3 & 6, then 4 & 5, then 7 & 8, then AUTO, then 1 & 2, etc. repeated in this order.
8. change the values of subscripts w and x appropriate for the lines to be used.
9. if this is the AUTO mode and the selected cable pair has a fault, then cycle through the pairs until one is found that is free from faults. The cycle pairs are: 1 &2, then 3&6,then 4&5,then7&8.

107. Make Changes to Bring Count Within Limits

The software makes the following changes should the oscillator pulse count be too low or conversely, too high and counter overflow occurs. The maximum and minimum limits for the counter is saved in the microprocessor memory.
1. connect R18 in parallel with R16
2. connect R26 in parallel with R17
3. increase the gate time interval
4. decrease the gate time interval While the presently preferred form of the invention has been disclosed in detail in order to comply with the patent laws, it will be understood that the scope of the invention is limited only in accordance with t he appended claims.

I claim:

1. The method of measuring from only one of its ends the length of a cable whose capacitance per unit length is previously known, comprising the steps of:

selecting an oscillator circuit into which a desired capacitor may be selectively inserted, the oscillator circuit being characterized by an operating frequency substantially proportional to the capacitance value of the inserted capacitor;

inserting into the oscillator circuit a reference capacitor whose capacitance value is known;

then operating the oscillator circuit a predetermined period of time while counting a first number of oscillations it generates;

thereafter inserting the one end of the cable into the oscillator circuit in lieu of the reference capacitor, and again operating the oscillator circuit for the same predetermined period of time while counting a second number of oscillations it then generates;

comparing the first and second numbers of oscillations to obtain a ratio;

combining the ratio with the known capacitance to produce a result indicating cable capacitance; and then combining the cable capacitance with the previously known capacitance per unit length of the cable to produce a result indicating the length of the cable.

2. The method of measuring from only one of its ends the length of a cable whose capacitance per unit length has been previously known, comprising the steps of:

selecting an oscillator circuit into which a desired capacitor may be selectively inserted, the oscillator circuit being characterized by an operating frequency substantially proportional to the capacitance value of the inserted capacitor;

inserting into the oscillator circuit a reference capacitor whose capacitance value is known, to thereby control the frequency of the oscillator;

while the reference capacitor is operatively coupled therein, operating the oscillator circuit so as to determine an operating frequency associated with the reference capacitor;

inserting one end of the cable into the oscillator circuit to thereby control the frequency of the oscillator;

while the cable is operatively coupled therein, operating the oscillator circuit so as to determine an operating frequency associated with the cable;

comparing the two thus-measured operating frequencies to obtain a frequency ratio;

combining the frequency ratio with the known capacitance to produce a result indicating cable capacitance; and then combining the cable capacitance with the previously known capacitance per unit length of the cable to produce a result indicating the length of the cable.

3. The measurement method of claim 2 wherein the oscillator is operated throughout the same known period of time for each of the inserted capacitors, and the number of its oscillations during the known time period is counted to determine its operating frequency corresponding to each inserted capacitor.

4. The measurement method of claim 2 wherein the known time period is adjusted to improve the accuracy of the count.

5. Test apparatus for measuring from only one of its ends the length of a cable whose capacitance per unit length is already known, the apparatus comprising:

a reference capacitor having a known capacitance value;

an oscillator circuit adapted for the insertion therein of a selected capacitor such that the operating frequency of the oscillator circuit will then be substantially proportional to the capacitance value of the inserted capacitor;

means for selectively inserting the reference capacitor into the oscillator circuit to control its operation;

means for selectively inserting the one end of the cable into the oscillator circuit to providing a capacitor for controlling its operation;

means for measuring the oscillating frequency of the oscillator circuit when either of the selected capacitors has been inserted therein;

means for comparing the two measured oscillation frequencies to obtain a ratio;

means for combining the ratio with the known capacitance to produce a result indicating cable capacitance; and means for combining the cable capacitance with the previously known capacitance per unit length of the cable to produce a result indicating the length of the cable.

6. The test apparatus of claim 5 which includes timing means associated with the oscillator circuit for timing its operation during a predetermined period of time; and counting means associated with the oscillator circuit and cooperating with the timing means for counting the number of oscillations of the oscillator circuit during the predetermined period of time.

7. Test apparatus as in claim 6 which includes means for adjusting the duration of the predetermined period of time to accommodate length of a particular cable that is being tested.

8. Test apparatus for measuring from only one of its ends the length of a cable whose capacitance per unit length is already known, the apparatus comprising:

a reference capacitor having a known capacitance value;

an oscillator circuit adapted for the insertion therein of a selected capacitor such that the operating frequency of the oscillator circuit will then be substantially proportional to the capacitance value of the inserted capacitor;

timing means associated with the oscillator circuit for timing its operation during a predetermined period of time;

counting means associated with the oscillator circuit and cooperating with the timing means for counting the number of oscillations of the oscillator circuit during the predetermined period of time;

means for inserting a selected one of the reference capacitor and the cable end into the oscillator circuit and maintaining it there for the predetermined period of time;

means for storing a first number of pulses generated by the oscillator circuit during that predetermined period of time;

means for then inserting the other of the reference capacitor and the cable end into the oscillator circuit and maintaining it there for the predetermined period of time;

means for counting the number of pulses generated by the oscillator circuit during each aforesaid time period;

means for storing first and second numbers of pulses, respectively, that are generated by the oscillator circuit during the two respective predetermined periods of time;

means for comparing the two stored numbers of pulses to obtain a ratio;

means for combining the ratio with the known capacitance to produce a result indicating cable capacitance; and means for combining the cable capacitance with the previously known capacitance per unit length of the cable to produce a result indicating the length of the cable.

9. Circuitry for measuring the capacitance value of an unknown capacitor, comprising:

an oscillator circuit adapted for insertion of a selected capacitor and whose operating frequency is then substantially proportional to the inserted capacitance value;

a reference capacitor having a known capacitance value;

means for selectively inserting either the reference capacitor or the unknown capacitor into the oscillator circuit;

timing means associated with the oscillator circuit for timing its output during a predetermined period of time;

counting means associated with the oscillator circuit for counting its output pulses during that period of time;

means for storing a first number of pulses generated by the oscillator circuit when the reference capacitor has been inserted therein;

means for storing a second number of pulses generated by the oscillator circuit when the unknown capacitor has been inserted therein;

means for comparing the two numbers of pulses to obtain a ratio; and means for combining the ratio with the known capacitance to produce a result representing the value of the unknown capacitance.

10. The method of measuring the length of an electrical cable, comprising the steps of:

selecting a reference capacitor having a known capacitance value;

selecting at one end of the cable, the ends of a conductor pair to serve as contacts for a test capacitor;

alternately inserting the reference capacitor and the test capacitor into a stable oscillator while measuring the two associated operating frequencies of the oscillator;

comparing the two oscillator frequencies to provide a ratio;

combining the ratio with the known capacitance to produce a result indicating cable capacitance; and then combining the cable capacitance with a number that is indicative of the capacitance per unit length of the cable to produce an output number representing the cable length.

* * * * *